(12) United States Patent
Ishida et al.

(10) Patent No.: US 11,430,664 B2
(45) Date of Patent: Aug. 30, 2022

(54) ETCHING METHOD AND PLASMA PROCESSING APPARATUS

(71) Applicant: Tokyo Electron Limited, Tokyo (JP)

(72) Inventors: Wakako Ishida, Miyagi (JP); Masaaki Kikuchi, Miyagi (JP); Wataru Togashi, Miyagi (JP); Yasunori Hatamura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/158,141

(22) Filed: Jan. 26, 2021

(65) Prior Publication Data

US 2021/0233776 A1    Jul. 29, 2021

(30) Foreign Application Priority Data

Jan. 28, 2020   (JP) .............................. JP2020-011998

(51) Int. Cl.
*H01L 21/311*  (2006.01)
*H01L 21/3065* (2006.01)
*H01J 37/32*   (2006.01)
*H01L 21/02*   (2006.01)

(52) U.S. Cl.
CPC .. *H01L 21/31116* (2013.01); *H01J 37/32449* (2013.01); *H01L 21/02164* (2013.01); *H01L 21/3065* (2013.01); *H01J 2237/334* (2013.01)

(58) Field of Classification Search
None
See application file for complete search history.

(56) References Cited

U.S. PATENT DOCUMENTS

2016/0284555 A1*  9/2016  Bae ................... H01L 21/31144

FOREIGN PATENT DOCUMENTS

JP          2013-183063 A      9/2013

\* cited by examiner

*Primary Examiner* — Roberts P Culbert
(74) *Attorney, Agent, or Firm* — Pearne & Gordon LLP

(57) ABSTRACT

An etching method includes etching a first silicon-containing film of a substrate by plasma of a first processing gas; and etching a second silicon-containing film of the substrate by plasma of a second processing gas. The etching of the first silicon-containing film and the etching of the second silicon-containing film are repeated a preset number of times.

4 Claims, 8 Drawing Sheets

ETCHING METHOD AND PLASMA PROCESSING APPARATUS

CROSS-REFERENCE TO RELATED APPLICATION

This application claims the benefit of Japanese Patent Application No. 2020-011998 filed on Jan. 28, 2020, the entire disclosure of which is incorporated herein by reference.

TECHNICAL FIELD

The various aspects and embodiments described herein pertain generally to an etching method and a plasma processing apparatus.

BACKGROUND

In the manufacture of a three-dimensional stacked semiconductor memory such as a 3D NAND flash memory, there is performed a process of etching a multilayer film to have a step shape by using plasma. Patent Document 1 describes a technique of etching a multilayer film to have a step shape by performing etching of the multilayer film having a mask formed on a surface thereof and trimming of the mask on the multilayer film alternately.

Patent Document 1: Japanese Patent Laid-open Publication No. 2013-183063

SUMMARY

In one exemplary embodiment, there is provided an etching method of etching a substrate having multiple first silicon-containing films and multiple second silicon-containing films alternately stacked on top of each other. The etching method includes etching the first silicon-containing film of the substrate by plasma of a first processing gas; and etching the second silicon-containing film of the substrate by plasma of a second processing gas. The etching of the first silicon-containing film and the etching of the second silicon-containing film are repeated a preset number of times.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
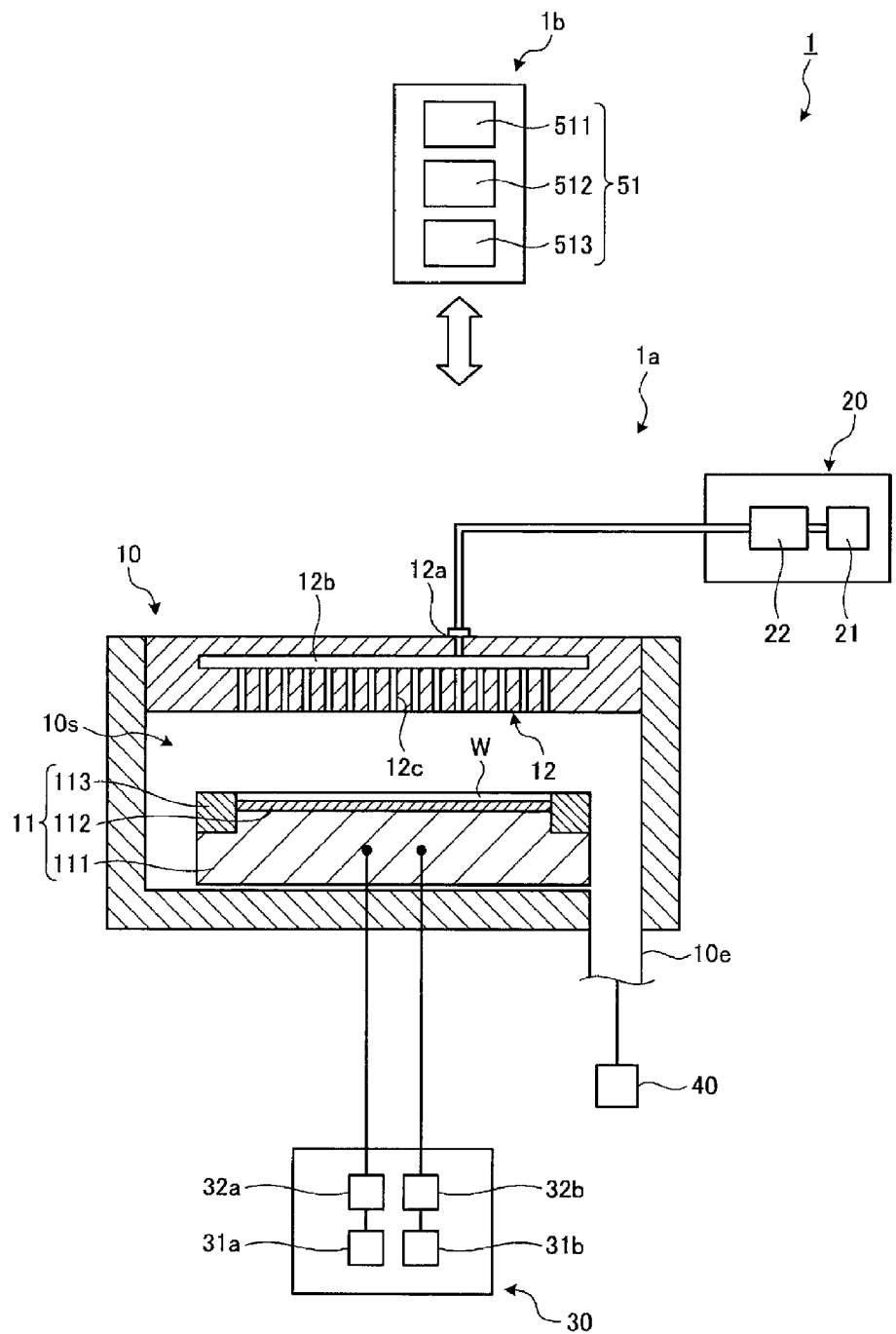
FIG. 1 is a cross sectional view illustrating an example configuration of a plasma processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of an etching method and a plasma processing apparatus according to the present disclosure will be described in detail with reference to the accompanying drawings. Here, however, it should be noted that the etching method and the plasma processing apparatus of the present disclosure are not limited by the exemplary embodiments.

When etching a multilayer film having a plurality of first silicon-containing films and a multiplicity of second silicon-containing films alternatively stacked on top of each other, the etching needs to be performed with high in-plane uniformity within a surface of each layer. By way of example, when etching a multilayer film having a step shape, the etching needs to be performed with high in-plane uniformity in order to maintain the step shape.

[Apparatus Configuration]

A plasma processing apparatus according to an exemplary embodiment will be explained. The following description will be provided for an example where a plasma processing system 1 has the plasma processing apparatus of the exemplary embodiment as a system configuration. FIG. 1 is a cross sectional view illustrating an example configuration of the plasma processing system 1 according to the exemplary embodiment.

In the exemplary embodiment, the plasma processing system 1 includes a plasma processing apparatus 1a and a controller 1b. The plasma processing apparatus 1a includes a plasma processing chamber 10, a gas supply 20, a RF (Radio Frequency) power supply 30 and an exhaust system 40. Further, the plasma processing apparatus 1a is equipped with a support 11 and an upper electrode shower head 12. The support 11 is placed in a lower region of a plasma processing space 10s within the plasma processing chamber 10. The upper electrode shower head 12 is disposed above the support 11 and serves as a part of a ceiling of the plasma processing chamber 10.

The support 11 is configured to support a substrate W in the plasma processing space 10s. In the exemplary embodiment, the support 11 includes a lower electrode 111, an electrostatic chuck 112 and an edge ring 113. The electrostatic chuck 112 is disposed on the lower electrode 111 and configured to support the substrate W on a top surface thereof. The edge ring 113 is disposed on a top surface of a peripheral portion of the lower electrode 111 to surround the substrate W. Further, though not shown, the support 11 in the present exemplary embodiment may include a temperature control module configured to adjust at least one of the electrostatic chuck 112 and the substrate W to a target temperature. The temperature control module may include a heater, a flow path, or a combination thereof. A temperature control fluid such as a coolant or a heat transfer gas flows in the flow path.

The upper electrode shower head 12 is configured to supply one or more processing gases from the gas supply 20 into the plasma processing space 10s. In the exemplary embodiment, the upper electrode shower head 12 has a gas inlet 12a, a gas diffusion space 12b and a multiple number of gas outlets 12c. The gas inlet 12a communicates with the gas supply 20 and the gas diffusion space 12b so that a fluid flows therebetween. The multiple number of gas outlets 12c communicate with the gas diffusion space 12b and the plasma processing space 10s so that the fluid flows therebetween. In the exemplary embodiment, the upper electrode shower head 12 is configured to supply the one or more processing gases from the gas inlet 12a into the plasma processing space 10s through the gas diffusion space 12b and the multiple number of gas outlets 12c.

The gas supply 20 may include one or more gas sources 21 and one or more flow rate controllers 22. In the exemplary embodiment, the gas supply 20 is configured to supply the one or more processing gases into the gas inlet 12a from the corresponding gas sources 21 via the corresponding flow rate controllers 22. Each flow rate controller 22 may include, by way of example, a mass flow controller or a pressure control type flow rate controller. Further, the gas supply 20 may include one or more flow rate modulating device configured to modulate or pulse a flow rate of the one or more processing gases.

The RF power supply 30 is configured to supply a RF power, for example, one or more RF signals, to one or more electrodes, that is, to either one of the lower electrode 111 and the upper electrode shower head 12 or both of the lower electrode 111 and the upper electrode shower head 12. Accordingly, plasma is formed from the one or more processing gases supplied into the plasma processing space 10s.

The RF power supply 30 is capable of serving as at least a part of a plasma formation unit configured to form the plasma from the one or more processing gases in the plasma processing chamber. In the exemplary embodiment, the RF power supply 30 includes two RF generators 31a and 31b and two matching circuits 32a and 32b. In the exemplary embodiment, the RF power supply 30 is configured to supply a first RF signal to the lower electrode 111 from the first RF generator 31a via the first matching circuit 32a. By way of example, the first RF signal may have a frequency within a range from 27 MHz to 100 MHz.

Further, in the exemplary embodiment, the RF power supply 30 is configured to supply a second RF signal from the second RF generator 31b to the lower electrode 111 via the second matching circuit 32b. By way of example, the second RF signal may have a frequency within a range from 400 kHz to 13.56 MHz. Here, a DC (Direct Current) pulse generator may be provided instead of the second RF generator 31b.

Furthermore, though not shown, another exemplary embodiment may be considered in the present disclosure. By way of example, in the another exemplary embodiment, the RF power supply 30 may be configured to supply a first RF signal to the lower electrode 111 from a RF generator, supply a second RF signal to the lower electrode 111 from another RF generator, and supply a third RF signal to the lower electrode 111 from still another RF generator. In addition, in still another exemplary embodiment, a DC voltage may be applied to the upper electrode shower head 12.

Moreover, in the various exemplary embodiments, an amplitude of the one or more RF signals (that is, the first RF signal, the second RF signal, and so forth) may be controlled in a pulse shape or modulated. The amplitude modulation may include controlling the amplitude of the RF signal in a pulse shape between an on state and an off state or between two or more different on states.

The exhaust system 40 may be connected to, for example, an exhaust port 10e provided at a bottom of the plasma processing chamber 10. The exhaust system 40 may include a pressure valve and a vacuum pump. The vacuum pump may include a turbo molecular pump, a roughing vacuum pump or a combination thereof.

In the exemplary embodiment, the controller 1b executes a computer-executable command for implementing various processes to be described in the present disclosure in the plasma processing apparatus 1a. The controller 1b may be configured to control the individual components of the plasma processing apparatus 1a to perform the various processes to be described later. In the exemplary embodiment, a part or the whole of the controller 1b may belong to the plasma processing apparatus 1a. The controller 1b may include, by way of example, a computer 51. The computer 51 may include, for example, a processor (CPU: Central Processing Unit) 511, a storage 512, and a communication interface 513. The processor 511 may be configured to perform various control operations based on a program stored in the storage 512. The storage 512 may include a RAM (Random Access Memory), a ROM (Read Only Memory), a HDD (Hard Disk Drive), a SSD (Solid State Drive), or combinations thereof. The communication interface 513 may communicate with the plasma processing apparatus 1a via a communication line such as a LAN (Local Area Network).

The plasma processing apparatus 1a including a part or the whole of the controller 1b corresponds to the plasma processing apparatus of the present disclosure.

The gas supply 20 is configured to be capable of supplying various gases for the etching. By way of example, the gas supply 20 is configured to supply the various gases such as fluorocarbon, hydrofluorocarbon, a rare gas, an oxygen-containing gas, a nitrogen-containing gas, and so forth. The gas supply 20 supplies the gases into the gas diffusion space 12b through the gas inlet 12a. The upper electrode shower head 12 introduces the gases supplied from the gas supply 20 into the plasma processing space 10s through the multiple number of gas outlets 12c. The controller 1b controls the gas supply 20 to supply the various gases into the plasma processing chamber 10.

The controller 1b controls the individual components of the plasma processing apparatus 1a to perform various processings. By way of example, the controller 1b controls the gas supply 20, the RF power supply 30 and the exhaust system 40 to perform the etching.

Now, a flow of the etching operation of the plasma processing apparatus 1a according to the exemplary embodiment will be briefly explained. When the etching is performed, a substrate W held on a transfer arm is transferred into the plasma processing chamber 10 from a non-illustrated gate valve, and placed on the electrostatic chuck 112.

The gas supply 20 introduces a processing gas for the etching into the plasma processing chamber 10 at a preset flow rate and a preset flow rate ratio. Further, the gas exhaust system 40 decompresses the plasma processing chamber 10 to a predetermined pressure value. Further, the RF power supply 30 supplies radio frequency powers of the first RF signal and the second RF signal having preset power levels to the lower electrode 111 from the RF generators 31a and 31b, respectively. The processing gas introduced into the plasma processing space 10s in a shower shape from the upper electrode shower head 12 is excited into plasma by the radio frequency power of the first RF signal from the RF power supply 30. Accordingly, the plasma is formed in the plasma processing space 10s. The plasma includes radicals and ions of the processing gas. The radicals in the plasma are supplied onto the substrate W by diffusion. The ions in the plasma are attracted toward the substrate W by a voltage of the radio frequency power of the second RF signal. Accordingly, a main surface of the substrate W is etched by interaction of the radicals and the ions supplied from the plasma.

Upon the completion of the plasma etching, the transfer arm is carried into the plasma processing chamber 10 from the non-illustrated gate valve. The transfer arm takes out the substrate W from the plasma processing chamber 10, and carries a next substrate W into the plasma processing chamber 10. By repeating this processing, substrates W are processed consecutively.

[Substrate Structure]

Figure 2:
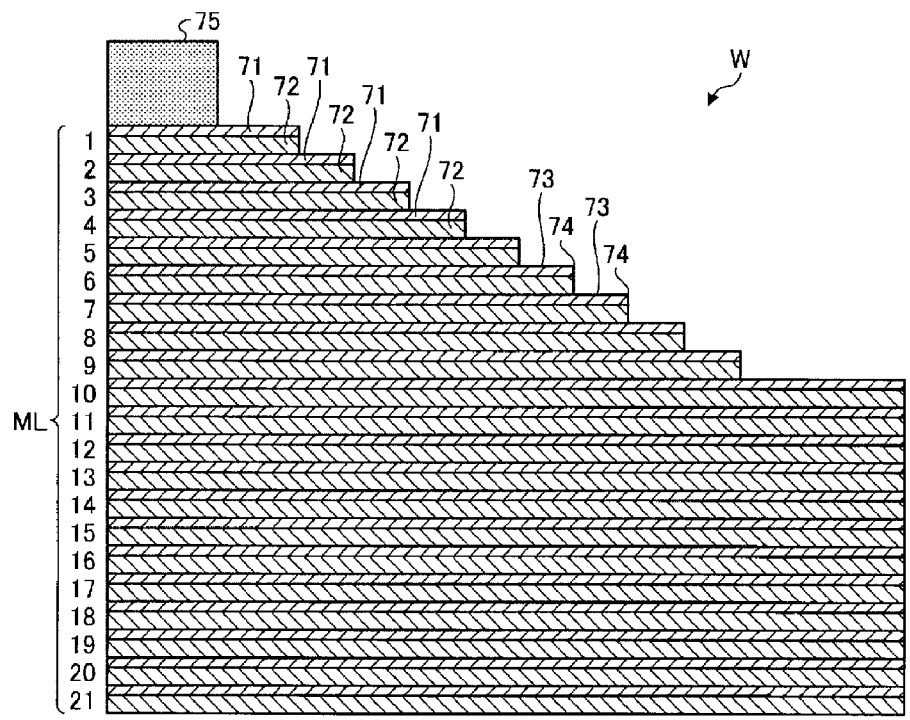
FIG. 2 is a diagram schematically illustrating an example of a structure of a substrate according to the exemplary embodiment.

Now, a structure of the substrate W according to the exemplary embodiment will be discussed. FIG. 2 is a diagram schematically illustrating an example of the structure of the substrate W according to the exemplary embodiment. The substrate W is, by way of example, a semiconductor wafer. The substrate W has a multiplayer film ML including a plurality of first silicon-containing films 71 and a multiplicity of second silicon-containing films 72 alternately stacked on top of each other. In FIG. 2, twenty one layers of the first silicon-containing film 71 and twenty one layers of the second silicon-containing film 72 are alternately stacked as the multilayer film ML. The first silicon-containing film 71 has a film thickness equal to or less than 50 nm, e.g., 30 nm. The second silicon-containing film 72 has a film thickness equal to or less than 50 nm, e.g., 30 nm.

Here, the number of the layers is not limited to the shown example. By way of example, the multilayer film ML may have several tens to several hundreds of layers of the first silicon-containing film 71 and the second silicon-containing film 72 alternately stacked on top of each other. Further, with an increase of the number of the layers, the film thickness of the first silicon-containing film 71 and the film thickness of the second silicon-containing film 72 tend to decrease.

The first silicon-containing film 71 and the second silicon-containing film 72 are insulating films having different dielectric constants. In the present exemplary embodiment, the first silicon-containing film 71 is a silicon oxide film ($SiO_2$), and the second silicon-containing film 72 is a silicon nitride film (SiN).

Here, however, a combination of the first silicon-containing film 71 and the second silicon-containing film 72 is not limited to the aforementioned combination of the silicon oxide film/silicon nitride film. By way of example, a polysilicon film (having been subjected to impurity doping) may be used as the first silicon-containing film 71, and a polysilicon film (without being subjected to impurity doping) may be used as the second silicon-containing film 72. By performing or not performing the doping, the dielectric constants of the first silicon-containing film 71 and the second silicon-containing film 72 can be set to be different. As an example, boron may be doped as an impurity in the impurity doping.

Further, as another example combination of the first silicon-containing film 71 and the second silicon-containing film 72, a silicon oxide film ($SiO_2$) may be used as the first silicon-containing film 71, and a polysilicon film (having been subjected to impurity doping) may be used as the second silicon-containing film 72. Further, as still another example, a silicon oxide film ($SiO_2$) may be used as the first silicon-containing film 71, and a polysilicon film (without being subjected to impurity doping) may be utilized as the second silicon-containing film 72.

The multilayer film ML of the substrate W is provided with steps in a step shape. In FIG. 2, in the multilayer film ML, a step of the step shape is formed in each layer containing the first silicon-containing film 71 and the second silicon-containing film 72. This step shape is formed by using a conventional technique of etching the step shape as described in, for example, Patent Document 1. Each step of the step shape of the multilayer film ML has a flat portion 73; and a leading end portion 74 as a protruding angled portion. Further, in the step shape, a step may be formed in each set of multiple layers containing the first silicon-containing film 71 and the second silicon-containing film 72. For example, in the step shape, a step may be formed for each set of two layers of the first silicon-containing film 71 and two layers of the second silicon-containing film 72 (every four layers). Further, the step shape may be formed in two directions. A step of a first step shape is formed for a set of two layers of the first silicon-containing film 71 and two layers of the second silicon-containing film 72 (every four layers). Further, a step of a second step shape is formed for a set of next two layers of the first silicon-containing film 71 and next two layers of the second silicon-containing film 72 (every next four layers) in a direction intersecting with the first step shape.

A photoresist layer 75 serving as a mask is formed near a region of the multilayer film ML where the step shape is formed. The photoresist layer 75 may be made of, by way of non-limiting example, an organic film or an amorphous carbon film (α-C).

When etching the multilayer film ML including the first silicon-containing films 71 and the second silicon-containing films 72 alternately stacked on top of each other, the etching needs to be performed with high in-plane uniformity for each layer. For example, when etching the multilayer film ML having the step shape as shown in FIG. 2, the etching needs to be performed with high in-plane uniformity for each step to maintain the step shape.

For the purpose, the plasma processing apparatus 1a forms the step shape of the multilayer film ML formed on the substrate W by performing an etching processing including a first etching process and a second etching process. In this etching processing, the first etching process and the second etching process are alternately repeated a preset number of times.

In the first etching process, the first silicon-containing film 71 is exposed on the topmost surface of the substrate W, and the second silicon-containing film 72 exists directly under this first silicon-containing film 71. In the first etching process, the plasma processing apparatus 1a according to the present exemplary embodiment supplies a first processing gas containing fluorocarbon into the plasma processing space 10s from the upper electrode shower head 12. The fluorocarbon may be, by way of non-limiting example, $C_4F_6$, $C_5F_8$, or $C_3F_8$. For example, in the first etching process, by supplying the first processing gas containing the $C_4F_6$ gas into the plasma processing space 10s from the upper electrode shower head 12, the exposed first silicon-containing film 71 of the multilayer film ML is etched. The first processing gas may further contain an argon (Ar) gas, an oxygen ($O_2$) gas, or the like. Accordingly, in the first etching process, an etching rate of the first silicon-containing film 71 becomes higher than an etching rate of the second silicon-containing film 72. By way of example, a selectivity of $SiO_2/SiN$ is equal to or larger than 5. Through the first etching process, the first silicon-containing film 71 exposed on the topmost surface of the substrate W is etched, so that the second silicon-containing film 72 is exposed on the topmost surface.

In the second etching process, the second silicon-containing film 72 is exposed on the topmost surface of the substrate W, and the first silicon-containing film 71 exists directly under this second silicon-containing film 72. In the second etching process, the plasma processing apparatus 1a according to the present exemplary embodiment supplies a second processing gas containing hydrofluorocarbon into the plasma processing space 10s from the upper electrode shower head 12. The hydrofluorocarbon may be, by way of non-limiting example, $CH_2F_2$, $CHF_3$, or $CH_3F$. For example, in the second etching process, by supplying the second processing gas containing the $CH_2F_2$ gas into the plasma processing space 10s from the upper electrode shower head 12, the exposed second silicon-containing film 72 of the multilayer film ML is etched. The second processing gas may further contain a $CF_4$ gas, an argon (Ar) gas, an oxygen ($O_2$) gas, or the like. Accordingly, in the second etching process, the etching rate of the second silicon-containing film 72 becomes higher than the etching rate of the first silicon-containing film 71. For example, a selectivity of $SiN/SiO_2$ is equal to or larger than 3. Through the second etching process, the second silicon-containing film 72 exposed on the topmost surface of the substrate W is etched, so that the first silicon-containing film 71 is exposed on the topmost surface.

Here, in the etching of the multilayer film ML having the step shape, etching rates of the flat portion 73 and the leading end portion 74 of each step of the step shape of the multilayer film ML varies depending on a processing condition of a plasma processing. For example, the etching rates of the flat portion 73 and the leading end portion 74 of the step shape of the multilayer film ML varies based on a pressure within the plasma processing chamber 10 in the plasma processing, or a power value of the second RF signal applied to attract the ions in the plasma.

Figure 3:
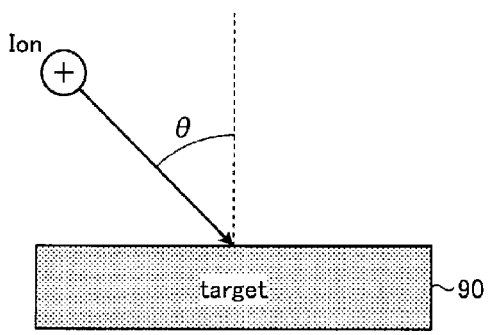
FIG. 3 is a diagram showing an incident angle of an ion upon a target film.

By way of example, in the plasma etching, a target film is etched as the radicals and ions in the plasma reach the target film. In the plasma etching, an etching amount has angle dependency. FIG. 3 is a diagram showing an incident angle of an ion upon a target film 90. FIG. 3 illustrates an incident angle θ of the ion upon the target film 90 with respect to a vertical direction.

Figure 4A:
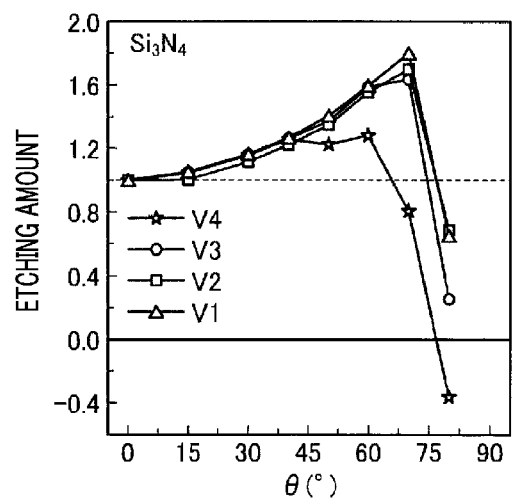
FIG. 4A is a graph showing an example relationship between an incident angle of an ion and an etching amount of a target film.
Figure 4B:
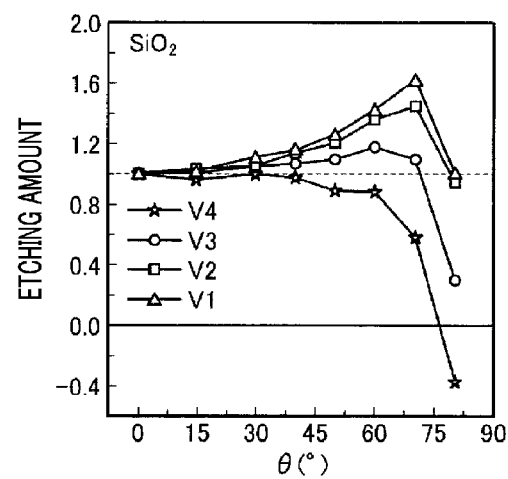
FIG. 4B is a graph showing an example relationship between an incident angle of an ion and an etching amount of a target film.

FIG. 4A and FIG. 4B present graphs showing examples of a relationship between the incident angle of the ion and the etching amount of the target film 90. Examples of FIG. 4A and FIG. 4B show relationships between the incident angle θ of the ion upon the target film 90 and the etching amount when the ion formed from the fluorocarbon gas is incident upon the target film 90, the target film 90 is inclined with respect to an incident direction of the ion, and incident energy of the ion is varied to V1 to V4 by using the ion beam device. The incident energy is large in the order of V1>V2>V3>V4. FIG. 4A shows an example where the target film 90 is a silicon nitride film ($Si_3N_4$ film), and FIG. 4B shows an example where the target film 90 is a silicon oxide film ($SiO_2$ film). The etching amount of the graph is expressed as a normalized value with the etching amount at the incident angle θ of zero (θ=0) defined as 1. As can be seen from the graph, the etching amount varies according to the incident angle θ of the ion. Specifically, the etching amount increases when the incident angle θ is in the range from 0° to 60° to 75° and if the incident angle θ exceeds 60° to 75°, the etching amount decreases rapidly. Further, a difference between the etching amount at the incident angle θ of 0° and the etching amount at the incident angle θ of 60° to 75° can be adjusted by controlling the incident energy of the ion. To reduce the difference between the etching amounts, it is desirable to reduce the incident energy of the ion. Further, FIG. 4B shows the case where the target film is the $SiO_2$ film, and the same tendency is observed for the $SiO_2$ film.

In the plasma etching, the ion in the plasma formed in the plasma processing space 10s by the radio frequency power of the first RF signal is attracted toward the substrate W by the voltage of the radio frequency power of the second RF signal. As a result, the main surface of the substrate W is etched by the plasma. At this time, the incident angle θ of the ion upon the main surface of the substrate W is almost 0°. Further, the incident energy of the ion is obtained by the voltage of the radio frequency power and is proportional to a power value of the radio frequency power of the second RF signal.

Figure 5:
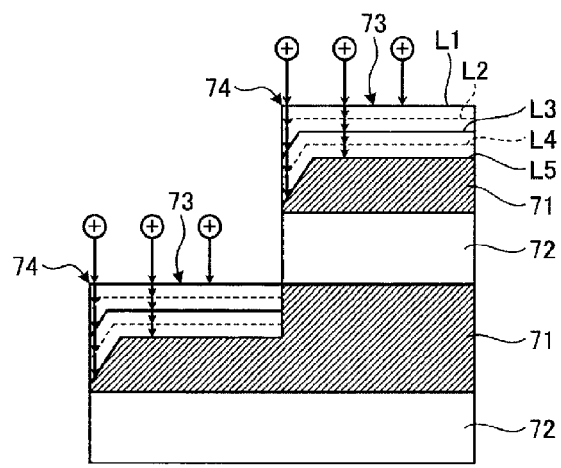
FIG. 5 is a diagram schematically illustrating an example of a change in a step shape of a multilayer film ML caused by plasma etching.

The leading end portion 74 of the step shape of the multilayer film ML has a protruding convex angle shape. If the leading end portion 74 (convex angle portion) is locally observed, it has various normal lines ranging from a horizontal line to a vertical line. That is, though the incident angle θ of the ion upon the flat portion 73 of each step of the step shape of the multilayer film ML is almost 0°, the incident angle θ of the ion upon the leading end portion 74 of the step shape of the multilayer film ML has various angles depending on a location. Therefore, if the power value of the radio frequency power of the second RF signal is high, the etching amount of the leading end portion 74 becomes larger than the etching amount of the flat portion 73, resulting in a shoulder cut in which the leading end portion 74 is given a gently sloped shape. FIG. 5 is a diagram schematically illustrating an example of changes in the step shape of the multilayer film ML caused by the plasma etching. In FIG. 5, changes of the first silicon-containing film 71 exposed on the top surface of the multilayer film ML with a lapse of time, which is caused by the plasma etching, are indicated by L1 to L5. L1 shows a state before the first silicon-containing film 71 is etched, and L5 shows a state upon the completion of the etching of the first silicon-containing film 71. Though FIG. 5 illustrates a case where the first silicon-containing film 71 exposed on the top surface is etched in the first etching process, the same changes are observed for the case where the second silicon-containing film 72 exposed on the top surface is etched in the second etching process. Since the multilayer film ML has the step shape, the etching progresses rapidly, starting from an edge portion of the leading end portion 74, and then, the leading end portion 74 is given the gently sloped shape. To set the etching amounts of the flat portion 73 and the leading end portion 74 of the step shape to be same, the power value of the radio frequency power of the second RF signal needs to be set to be low.

Thus, in the plasma processing apparatus 1a according to the present exemplary embodiment, the processing condition for the plasma processing is adjusted to allow the etching rates of the flat portion 73 and the leading end portion 74 of the step shape to be equal in each of the first etching process and the second etching process. For example, the voltage of the radio frequency power is adjusted to set the etching rates of the flat portion 73 and the leading end portion 74 of the step shape to be equal. Specifically, the pressure within the plasma processing chamber 10 in the plasma processing and the power value of the radio frequency power of the second RF signal applied to attract the ion in the plasma are adjusted to obtain the appropriate voltage of the radio frequency power. By way of example, in the first etching process, it is desirable that the pressure within the plasma processing chamber 10 in the plasma processing is set to range from 30 mTorr to 150 mTorr and the power value of the radio frequency power of the second RF signal per a unit area is set to be in a range from 0.5 W/cm$^2$ to 3.0 W/cm$^2$ so that the voltage of the radio frequency power becomes 1000 V to 2000 V. Further, in the first etching process, it is more desirable that the pressure within the plasma processing chamber 10 in the plasma processing is set to range from 50 mTorr to 100 mTorr and the power value of the radio frequency power of the second RF signal per a unit area is set to be in a range from 1.0 W/cm$^2$ to 2.5 W/cm$^2$ so that the voltage of the radio frequency power becomes 1300 V to 1800 V. In the second etching process, it is desirable that the pressure within the plasma processing chamber 10 in the plasma processing is set to range from 30 mTorr to 150 mTorr and the power value of the radio frequency power of the second RF signal, which is applied to attract the ion, per a unit area is set to be in a range from 0.5 W/cm$^2$ to 2.0 W/cm$^2$ so that the voltage of the radio frequency power becomes 1000 V to 2000 V. Furthermore, it is more desirable that the pressure within the plasma processing chamber 10 in the plasma processing is set to range from 50 mTorr to 100 mTorr and the power value of the radio frequency power of the second RF signal, which is applied to attract the ion, per a unit area is set to be in a range from 1.0 W/cm$^2$ to 2.5 W/cm$^2$ so that the voltage of the radio frequency power becomes 1300 V to 1800 V. Accordingly, in the plasma processing apparatus 1a according to the present exemplary embodiment, the etching can be performed with the same etching amount for the flat portion 73 and the leading end portion 74 of the step shape in the first etching process and the second etching process.

In the plasma processing apparatus 1a, the first etching process and the second etching process are repeated according to the stacking number of the first silicon-containing film 71 and the second silicon-containing film 72 to be etched.

Figure 6:
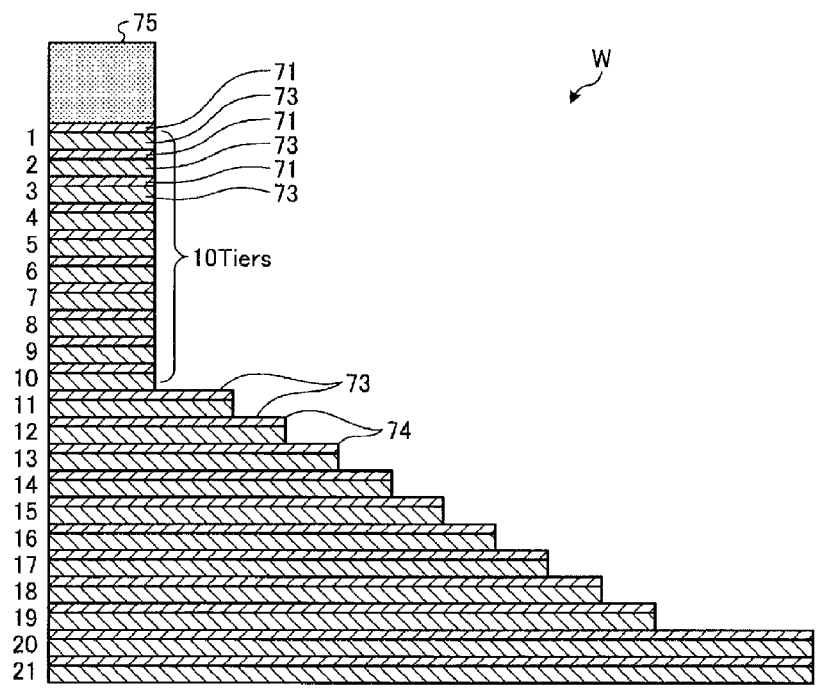
FIG. 6 is a diagram schematically illustrating an example of an etching result by an etching method according to the exemplary embodiment.
Figure 7:
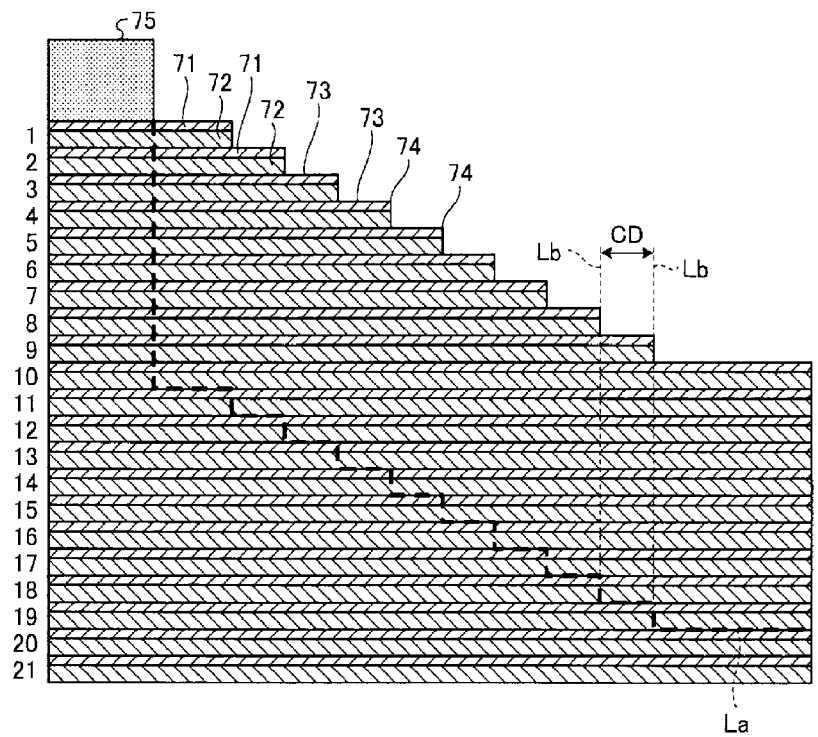
FIG. 7 is a diagram illustrating a region etched by the etching method according to the exemplary embodiment.

FIG. 6 is a diagram schematically illustrating an example of an etching result by an etching method according to the exemplary embodiment. In the example of FIG. 6, the first etching process and the second etching process are repeated ten times upon the substrate W shown in FIG. 2, and ten layers of each of the first silicon-containing film 71 and the second silicon-containing film 72 are etched. FIG. 7 is a diagram showing a region etched by the etching method according to the exemplary embodiment. In FIG. 7, the etched region of FIG. 6 on the substrate W of FIG. 2 is indicated by a dashed line La. Since the plasma processing apparatus 1a according to the present exemplary embodiment is capable of etching the flat portion 73 and the leading end portion 74 of the first silicon-containing film 71 of each step of the step shape to same extent through the first etching process, the first silicon-containing film 71 of each step of the step shape can be etched flat. Moreover, since the plasma processing apparatus 1a according to the present exemplary embodiment is capable of etching the flat portion 73 and the leading end portion 74 of the second silicon-containing film 72 of each step of the step shape to same extent through the second etching process, the second silicon-containing film 72 of each step of the step shape can be etched flat. Therefore, the plasma processing apparatus 1a according to the present exemplary embodiment is capable of etching each step of the step shape with high in-plane uniformity. Moreover, the plasma processing apparatus 1a according to the present exemplary embodiment is capable of etching the first silicon-containing film 71 and the second silicon-containing film 72 substantially vertically in the first etching process and the second etching process. Therefore, the plasma processing apparatus 1a according to the present exemplary embodiment is capable of suppressing a change of a position of each step of the step shape, thus capable of suppressing a change of the flat portion of each step of the step shape. In FIG. 7, positions of the leading end portion 74 of each step of the step shape before and after the etching are indicated by dashed lines Lb, and a width of the flat portion of the step shape is indicted as a CD (Critical Dimension). The plasma processing apparatus 1a of the present exemplary embodiment is capable of etching the first silicon-containing film 71 and the second silicon-containing film 72 while maintaining the CD constant.

Here, in the conventional etching of a step shape, the first silicon-containing film 71 and the second silicon-containing film 72 are etched at the same time by performing a plasma processing with a processing gas containing, for example, a $CF_4$ gas and an Ar gas under a condition that an etching rate of the first silicon-containing film 71 and an etching rate of the second silicon-containing film 72 are substantially same, for example, under a condition that a selectivity of $SiO_2$/SiN is about 1. In the conventional etching method in which the first silicon-containing film 71 and the second silicon-containing film 72 are etched at the same time, the leading end portion 74 having the step shape is etched faster than the flat portion 73, resulting in the shoulder cut in which the leading end portion 74 is given a gently sloped shape.

Figure 8A:
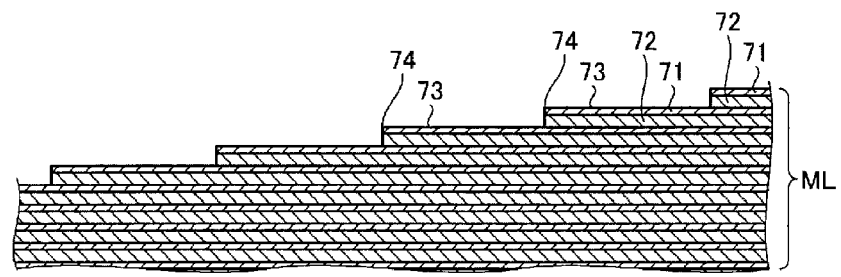
FIG. 8A is a perspective view illustrating an example of a step shape etched by an etching method according to the exemplary embodiment.
Figure 8B:
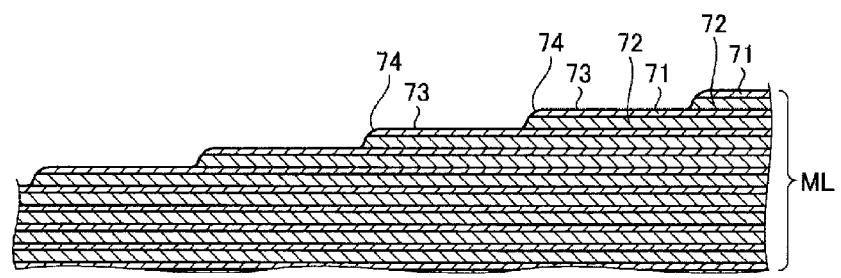
FIG. 8B is a perspective view illustrating an example of a step shape etched by a conventional etching method.

FIG. 8A is a perspective view illustrating an example of the step shape etched by the etching method according to the exemplary embodiment. FIG. 8B is a perspective view illustrating an example of the step shape etched by the conventional etching method. FIG. 8A and FIG. 8B illustrate SEM (Scanning Electron Microscope) images. In the etching method according to the present exemplary embodiment, the etching can be performed while maintaining the shape of each step of the step shape, as depicted in FIG. 8A. Meanwhile, in the conventional etching method, there is caused the shoulder cut in which the leading end portion 74 at each step of the step shape has a gently sloped shape, as depicted in FIG. 8B.

In the manufacture of a three-dimensional stacked semiconductor memory such as a 3D NAND flash memory, a metal wiring for contact is formed at each step of the step shape of the multilayer film ML of the substrate W. If, however, the shoulder cut occurs at each step of the step shape as in the conventional etching method, there is a concern that this metal wiring may be electrically connected with a wiring layer of another step.

Figure 9A:
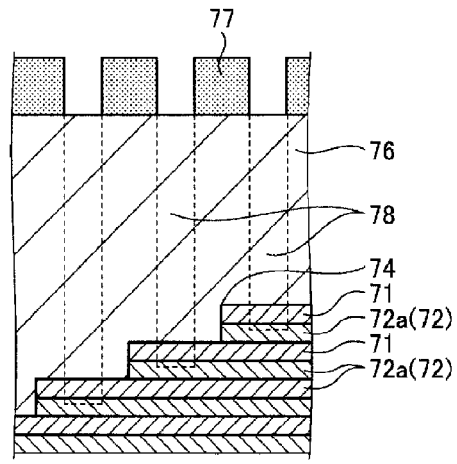
FIG. 9A is a diagram schematically illustrating a state in which a metal wiring for contact is formed at each step of the step shape formed by the etching method according to the exemplary embodiment.
Figure 9B:
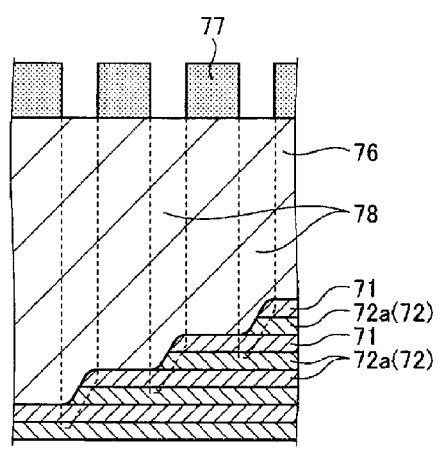
FIG. 9B is a diagram schematically illustrating a state in which a metal wiring for contact is formed at each step of the step shape etched by the conventional etching method.

FIG. 9A is a diagram schematically illustrating a state in which the metal wiring for contact is formed at each step of the step shape etched by the etching method according to the present exemplary embodiment. FIG. 9B is a diagram schematically illustrating a state in which the metal wiring for contact is formed at each step of the step shape etched by the conventional etching method. In FIG. 9A and FIG. 9B, a SiO$_2$ layer 76 is further stacked on the multilayer film ML of the substrate W provided with the step shape, and a photoresist layer 77 having patterns at positions corresponding to where metal wirings are to be formed is stacked on the SiO$_2$ layer 76. In FIG. 9A and FIG. 9B, positions of metal wirings 78 are indicated by dashed lines. In FIG. 9A and FIG. 9B, a wiring layer 72a made of, for example, tungsten is formed in the second silicon-containing film 72 of each step of the step shape. In the etching method according to the present exemplary embodiment, since the shape of the steps of the step shape is maintained as illustrated in FIG. 9A, each metal wiring 78 is allowed to be electrically connected to the wiring layer 72a of corresponding one of the individual steps. Meanwhile, in the conventional etching method, since there is caused the shoulder cut in which the leading end portion 74 of each step of the step shape is given the gently sloped shape as illustrated in FIG. 9B, each metal wiring 78 is electrically connected to the wiring layers 72a of the upper and lower adjacent steps.

[Flow of Etching]

Figure 10:
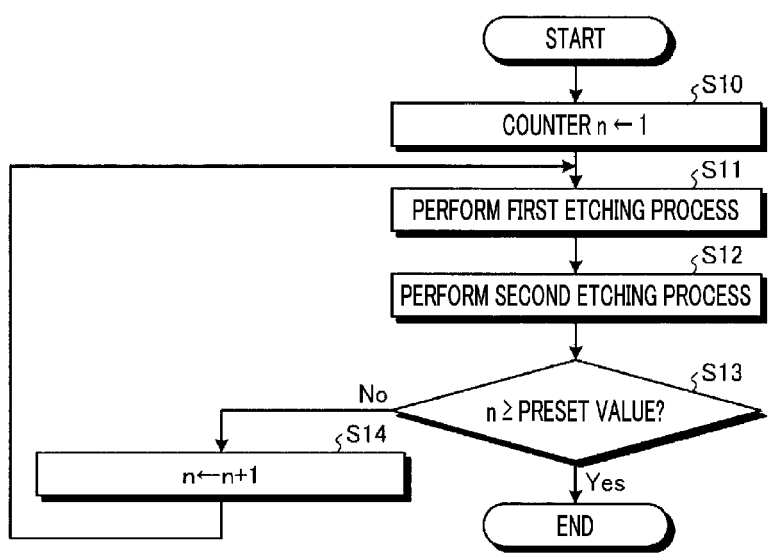
FIG. 10 is a flowchart illustrating an example flow of the etching method according to the exemplary embodiment.

Now, a flow of the etching method performed by the plasma processing apparatus 1a according to the present exemplary embodiment will be explained. FIG. 10 is a flowchart illustrating an example of the flow of the etching method according to the exemplary embodiment. FIG. 10 presents a flow of an etching process of forming a step shape.

The controller 1b initializes a counter n to 1 (process S10). The controller 1b controls the plasma processing apparatus 1a to perform, on the substrate W placed within the plasma processing chamber 10, the first etching process of etching the multilayer film ML by plasma of the first processing gas containing the fluorocarbon gas (process S11). The controller 1b controls the plasma processing apparatus 1a to perform the second etching process of etching the multilayer film ML by plasma of the second processing gas containing the hydrofluorocarbon gas (process S12).

The controller 1b makes a determination upon whether a value of the counter n reaches equal to or larger than a preset value corresponding to the number of steps to be etched (process S13). If the value of the counter n is less than the preset value (S13: No), the controller 1b adds 1 to the counter n (process S14), and returns to the above-stated process S11.

Meanwhile, if the value of the counter n is equal to or larger than the preset value (S13: Yes), the processing is ended.

[Effects]

As described above, the plasma processing apparatus 1a according to the exemplary embodiment etches the substrate W on which the first silicon-containing films 71 and the second silicon-containing films 72 are alternately stacked. The plasma processing apparatus 1a performs the first etching process of etching the first silicon-containing film 71 of the substrate W by the plasma of the first processing gas and the second etching process of etching the second silicon-containing film 72 of the substrate W by the plasma of the second processing gas. The plasma processing apparatus 1a repeats the first etching process and the second etching process a predetermined number of times. Accordingly, the plasma processing apparatus 1a is capable of carrying out the etching while maintaining the in-plane uniformity.

Further, in the multilayer film ML of the substrate W including the first silicon-containing films 71 and the second silicon-containing films 72 alternately stacked on top of each other, the step of the step shape is formed for each layer containing the first silicon-containing film 71 and the second silicon-containing film 72 or for each set of multiple layers of the first silicon-containing film 71 and the second silicon-containing film 72. In the plasma processing apparatus 1a, the first silicon-containing film 71 is exposed on the topmost surface of the substrate W in the first etching process. In the first etching process, the etching rate of the flat portion of the first silicon-containing film 71 of each step of the step shape is equal to the etching rate of the leading end portion of the first silicon-containing film 71 of each step of the step shape. In the plasma processing apparatus 1a, the second silicon-containing film 72 is exposed on the topmost surface of the substrate W in the second etching process. In the second etching process, the etching rate of the flat portion of the second silicon-containing film 72 of each step of the step shape is equal to the etching rate of the leading end portion of the second silicon-containing film 72 of each step of the step shape. Accordingly, the shoulder cut of each step of the step shape, which has occurred in the conventional etching method, can be suppressed. Therefore, when the metal wiring for contact is formed at each step, this metal wiring can be suppressed from being electrically connected to the metal wiring of another step.

In the first etching process, the first silicon-containing film 71 is exposed on the topmost surface of the substrate W, and the second silicon-containing film 72 exists directly under this first silicon-containing film 71. In the first etching process, the etching rate of the first silicon-containing film 71 is higher than the etching rate of the second silicon-containing film 72. In the second etching process, the second silicon-containing film 72 is exposed on the topmost surface of the substrate W, and the first silicon-containing film 71 exists directly under this second silicon-containing film 72. In the second etching process, the etching rate of the second silicon-containing film 72 is higher than the etching rate of the first silicon-containing film 71. Accordingly, the first silicon-containing film 71 can be etched effectively in the first etching process, and the second silicon-containing film 72 can be etched effectively in the second etching process.

Further, the first silicon-containing film 71 is the silicon oxide film. The second silicon-containing film 72 is the silicon nitride film. The first processing gas contains the fluorocarbon gas. The second processing gas contains the hydrofluorocarbon gas. Accordingly, the silicon oxide film can be etched effectively in the first etching process, and the silicon nitride film can be etched effectively in the second etching process.

So far, the various exemplary embodiments have been described. However, the exemplary embodiments are not limiting, and various modifications and replacements may be made without departing from the scope of the present disclosure as claimed in the following claims.

By way of example, though the above exemplary embodiment has been described for the example where the multi-layer film ML provided with the step shape is etched, the exemplary embodiment is not limited thereto. The etching method of the present exemplary embodiment may also be applicable to etching of a substrate W on which the first silicon-containing film 71 and the second silicon-containing film 72 are alternately stacked without having the step shape.

In addition, though the above exemplary embodiment has been described for the example where the substrate W is the semiconductor wafer, the exemplary embodiment is not limited thereto. The substrate W may be any of various types as long as a step shape needs to be formed thereon.

According to the exemplary embodiment, it is possible to perform the etching while maintaining high in-plane uniformity.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. An etching method of etching a substrate having multiple first silicon-containing films and multiple second silicon-containing films alternately stacked on top of each other, the etching method comprising:
   etching the first silicon-containing film of the substrate by plasma of a first processing gas; and
   etching the second silicon-containing film of the substrate by plasma of a second processing gas,
   wherein the etching of the first silicon-containing film and the etching of the second silicon-containing film are repeated a preset number of times,
   wherein the substrate has a multilayer film including the multiple first silicon-containing films and the multiple second silicon-containing films alternately stacked on top of each other, and in the multilayer film, a step of a step shape is formed in each of layers, the layer contains the first silicon-containing film and the second silicon-containing film, the first silicon-containing film has a flat portion and a leading end portion, the second silicon-containing film has a flat portion and a leading end portion,
   in the etching of the first silicon-containing film, the first silicon-containing film is exposed on a topmost surface of the substrate,
   in the etching of the first silicon-containing film, an etching rate of the flat portion of the first silicon-containing film in each step of the step shape is equal to an etching rate of the leading end portion of the first silicon-containing film in each corresponding step of the step shape,
   in the etching of the second silicon-containing film, the second silicon-containing film is exposed on the topmost surface of the substrate, and
   in the etching of the second silicon-containing film, an etching rate of the flat portion of the second silicon-containing film in each step of the step shape is equal to an etching rate of the leading end portion of the second silicon-containing film in each corresponding step of the step shape.

2. The etching method of claim 1,
   wherein in the etching of the first silicon-containing film, the first silicon-containing film is exposed on a topmost surface of the substrate, and the second silicon-containing film exists directly under the first silicon-containing film,
   in the etching of the first silicon-containing film, an etching rate of the first silicon-containing film is higher than an etching rate of the second silicon-containing film,
   in the etching of the second silicon-containing film, the second silicon-containing film is exposed on the topmost surface of the substrate, and the first silicon-containing film exists directly under the second silicon-containing film, and
   in the etching of the second silicon-containing film, the etching rate of the second silicon-containing film is higher than the etching rate of first silicon-containing film.

3. The etching method of claim 1,
   wherein the first silicon-containing film is a silicon oxide film,
   the second silicon-containing film is a silicon nitride film,
   the first processing gas includes a fluorocarbon gas, and
   the second processing gas includes a hydrofluorocarbon gas.

4. A plasma processing apparatus, comprising:
   a controller configured to repeat a preset number of times, upon a substrate including multiple first silicon-containing films and multiple second silicon-containing films alternately stacked on top of each other, a first etching process of etching the first silicon-containing film of the substrate by plasma of a first processing gas and a second etching process of etching the second silicon-containing film of the substrate by plasma of a second processing gas,
   wherein the substrate has a multilayer film including the multiple first silicon-containing films and the multiple second silicon-containing films alternately stacked on top of each other, and in the multilayer film, a step of a step shape is formed in each of layers, the layer contains the first silicon-containing film and the second silicon-containing film, the first silicon-containing film has a flat portion and a leading end portion, the second silicon-containing film has a flat portion and a leading end portion,
   in the etching of the first silicon-containing film, the first silicon-containing film is exposed on a topmost surface of the substrate,
   in the etching of the first silicon-containing film, an etching rate of the flat portion of the first silicon-containing film in each step of the step shape is equal to an etching rate of the leading end portion of the first silicon-containing film in each corresponding step of the step shape, in the etching of the second silicon-containing film, the second silicon-containing film is exposed on the topmost surface of the substrate, and in the etching of the second silicon-containing film, an etching rate of the flat portion of the second silicon-containing film in each step of the step shape is equal to an etching rate of the leading end portion of the second silicon-containing film in each corresponding step of the step shape.

* * * * *